(12) United States Patent
Kim et al.

(10) Patent No.: US 10,297,552 B2
(45) Date of Patent: May 21, 2019

(54) SEMICONDUCTOR DEVICE WITH EMBEDDED SEMICONDUCTOR DIE AND SUBSTRATE-TO-SUBSTRATE INTERCONNECTS

(71) Applicant: Amkor Technology, Inc., Tempe, AZ (US)

(72) Inventors: Jin Seong Kim, Goyang-si (KR); Ye Sul Ahn, Seoul (KR); Cha Gyu Song, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/357,551

(22) Filed: Nov. 21, 2016

(65) Prior Publication Data

US 2017/0162510 A1 Jun. 8, 2017

Related U.S. Application Data

(63) Continuation of application No. 14/522,572, filed on Oct. 23, 2014, now Pat. No. 9,502,392.

(30) Foreign Application Priority Data

Oct. 23, 2013 (KR) .......................... 10-2013-0126839

(51) Int. Cl.
*H01L 21/00* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC ............ H01L 23/5389; H01L 23/5386; H01L 23/3114; H01L 23/5384; H01L 23/5385;
(Continued)

(56) References Cited

U.S. PATENT DOCUMENTS 9,502,392 B2 11/2016 Kim et al.
2006/0012037 A1 1/2006 Raedt
(Continued)

FOREIGN PATENT DOCUMENTS

KR 10-2011-0076604 A 7/2011
KR 10-2012-0094712 A 8/2012

OTHER PUBLICATIONS

Korean Office Action dated Aug. 27, 2018 issued by the KIPO in Korean Patent Application No. 10-2013-0126839.

*Primary Examiner* — Hoa B Trinh
(74) *Attorney, Agent, or Firm* — McAndrews, Held & Malloy, Ltd.

(57) ABSTRACT

A semiconductor device having an embedded semiconductor die and substrate-to-substrate interconnects is disclosed and may include a substrate with a top surface and a bottom surface, a semiconductor die bonded to the top surface of the substrate, a first mold material encapsulating the semiconductor die and at least a portion of the top surface of the substrate, and a first conductive bump that is on the top surface of the substrate and is at least partially encapsulated by the first mold material. An extended substrate may be coupled to the substrate utilizing the first conductive bump. A second conductive bump may be formed on the bottom surface of the substrate, and a second mold material may encapsulate at least a portion of the second conductive bump and at least a portion of the bottom surface of the substrate. A third mold material may be formed between the first mold material and the extended substrate.

20 Claims, 20 Drawing Sheets

(51) Int. Cl.
*H01L 23/498* (2006.01)
*H01L 25/10* (2006.01)
*H01L 21/48* (2006.01)
*H01L 21/56* (2006.01)
*H01L 23/31* (2006.01)
*H01L 23/00* (2006.01)

(52) U.S. Cl.
CPC ........ *H01L 21/565* (2013.01); *H01L 23/3114* (2013.01); *H01L 23/49816* (2013.01); *H01L 23/5384* (2013.01); *H01L 23/5385* (2013.01); *H01L 23/5386* (2013.01); *H01L 25/105* (2013.01); *H01L 23/3128* (2013.01); *H01L 24/81* (2013.01); *H01L 2224/131* (2013.01); *H01L 2224/16225* (2013.01); *H01L 2225/1023* (2013.01); *H01L 2225/1058* (2013.01); *H01L 2225/1076* (2013.01); *H01L 2924/12042* (2013.01); *H01L 2924/15321* (2013.01); *H01L 2924/15331* (2013.01)

(58) Field of Classification Search
CPC . H01L 21/4853; H01L 21/486; H01L 21/565; H01L 24/25; H01L 24/82; H01L 24/24; H01L 2224/3225; H01L 2224/73267; H01L 2224/8203; H01L 2224/04105; H01L 2224/24226; H01L 2224/92244
See application file for complete search history.

(56) References Cited

U.S. PATENT DOCUMENTS

| | | | |
|---|---|---|---|
| 2010/0032822 A1* | 2/2010 | Liao | H01L 23/3128 257/690 |
| 2010/0289145 A1* | 11/2010 | Chipalkatti | H01L 23/36 257/758 |
| 2011/0068468 A1* | 3/2011 | Lin | H01L 23/49816 257/737 |
| 2012/0211885 A1 | 8/2012 | Choi et al. | |
| 2012/0286404 A1 | 11/2012 | Pagaila | |
| 2012/0326306 A1 | 12/2012 | Lee | |
| 2015/0108643 A1 | 4/2015 | Kim et al. | |

* cited by examiner

SEMICONDUCTOR DEVICE WITH EMBEDDED SEMICONDUCTOR DIE AND SUBSTRATE-TO-SUBSTRATE INTERCONNECTS

CROSS REFERENCE TO RELATED APPLICATIONS

The present application is a continuation of U.S. patent application Ser. No. 14/522,572, titled "A SEMICONDUCTOR DEVICE WITH EMBEDDED SEMICONDUCTOR DIE AND SUBSTRATE-TO-SUBSTRATE INTERCONNECTS," filed Oct. 23, 2014, issuing on Nov. 22, 2016 as U.S. Pat. No. 9,502,392, which makes reference to, claims priority to, and claims the benefit of Korean Patent Application No. 10-2013-0126839, filed on Oct. 23, 2013, the contents of each of which are hereby incorporated herein by reference in their entirety.

FIELD OF THE INVENTION

Certain example embodiments of the disclosure relate to semiconductor chip packaging. More specifically, certain example embodiments of the disclosure relate to a semiconductor device with embedded semiconductor die and substrate-to-substrate interconnects.

BACKGROUND

In general, when a semiconductor package is manufactured with a single-layered structure, it may suffer warpage due to its lamellar structure. A mold member may be utilized on top, bottom, or both sides to stiffen the structure, although this may excessively thicken the structure.

Further limitations and disadvantages of conventional and traditional approaches will become apparent to one of skill in the art, through comparison of such systems with the present invention as set forth in the remainder of the present application with reference to the drawings.

BRIEF SUMMARY

A semiconductor device with embedded semiconductor die and substrate-to-substrate interconnects, substantially as shown in and/or described in connection with at least one of the figures, as set forth more completely in the claims.

Various advantages, aspects and novel features of the present invention, as well as details of various illustrated example supporting embodiments, will be more fully understood from the following description and drawings.

DETAILED DESCRIPTION

Certain aspects of the disclosure may be found in a semiconductor device having an embedded semiconductor die and substrate-to-substrate interconnects. Example aspects of the disclosure may comprise a substrate having a top surface and a bottom surface, a semiconductor die bonded to the top surface of the substrate, a first conductive bump on the top surface of the substrate, and a first mold material encapsulating the semiconductor die, at least a portion of the first conductive bump, and at least a portion of the top surface of the substrate. The substrate may also have a second conductive bump on the first conductive bump, and an extended substrate coupled to the substrate utilizing the first and second conductive bumps. A second mold material may encapsulate at least a portion of the second conductive bump and at least a portion of a top surface of the first mold material. A third conductive bump may be formed on the bottom surface of the substrate. The extended substrate may comprise a fourth conductive bump coupled to the second conductive bump. A top surface of the first conductive bump may be coplanar with a top surface of the first mold material. A top surface of the first conductive bump may be below a top surface of the first mold material. The first conductive bump may comprises a copper pillar and the second conductive bump may comprise a solder ball. The extended substrate may comprise an interposer.

Figure 1A:
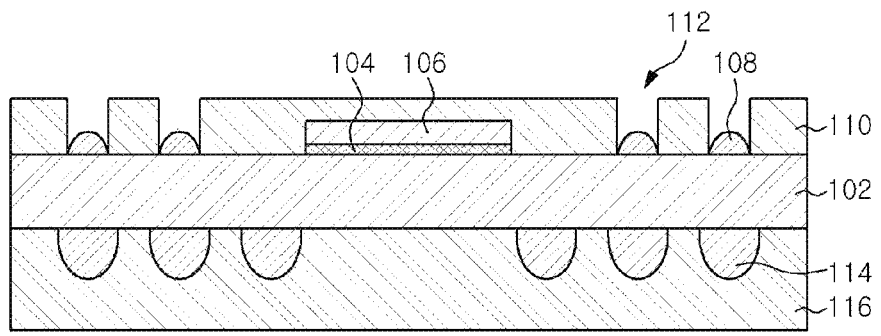
FIGS. 1A to 1C are process flows illustrating a process of manufacturing a semiconductor package, in accordance with an embodiment of the present disclosure.
Figure 1B:
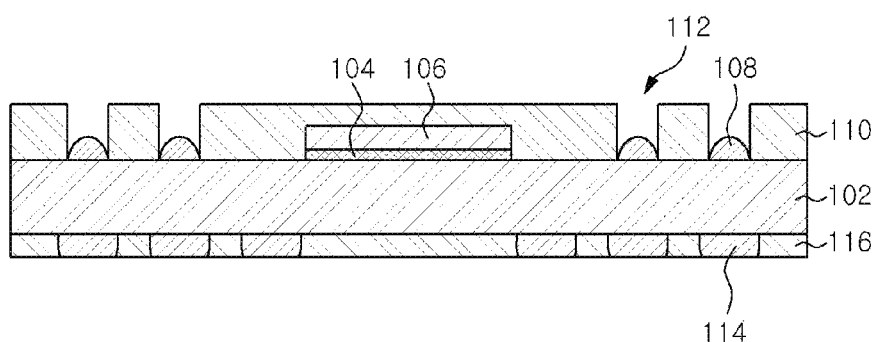
Figure 1C:
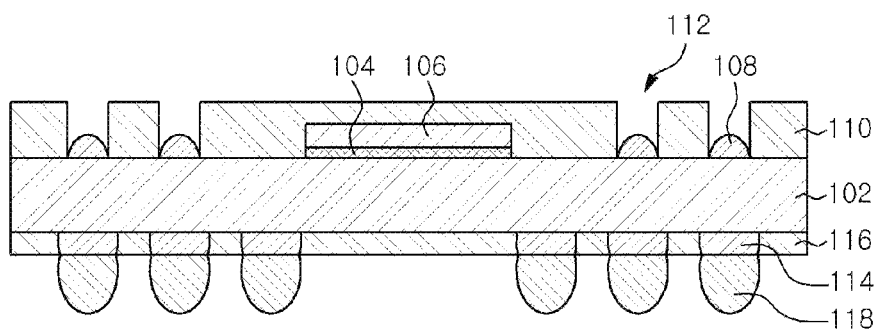

FIGS. 1A to 1C are process flows illustrating a process of manufacturing a semiconductor package, in accordance with an embodiment of the present disclosure.

Referring to FIG. 1A, a substrate may be prepared. In the substrate, a semiconductor die 106 and a plurality of top conductive bumps 108 encapsulated by a top mold member 110 may be formed on the top of a substrate 102, and a plurality of bottom conductive bumps 114 molded by a bottom mold member 116 may be formed on the bottom of the substrate 102.

A semiconductor die 106 may be attached through a bump member 104 at a target position on the top of the substrate 102. The bump member 104 may comprise solder balls, for example (not shown as individual solder balls for figure clarity), and a plurality of the top conductive bumps 108 may be formed at various positions on the substrate 102. Also, the top mold member 110 may be formed on the top of the substrate 102, which may mold (or bury) the semiconductor die 106 completely and expose the upper surfaces of top conductive bumps 108 selectively through openings 112.

The top and bottom conductive bumps 108 and 114 may comprise one or more of solder, solder balls, and conductive pillars (e.g., copper posts, aluminum posts, etc.), and the upper surface exposure of the top conductive bumps 108 may be realized by removing some of the top mold member 110 selectively using, for example, a laser drilling process.

According to an example embodiment of the present disclosure, each upper surface of a plurality of the top conductive bumps 108 may be exposed through each opening 112, although the disclosure is not limited thereto. Each top conductive bump 108 may also have a structure without the exposure of its upper surface if necessary.

A plurality of the bottom conductive bumps 114 may be formed at various positions on the bottom of the substrate 102 corresponding to positions desired for electrical interconnects, and these bottom conductive bumps 114 may be completely molded (or buried) by the thick bottom mold member 116.

Next, by performing a back grinding process for the bottom mold member 116, some upper parts of the bottom mold member 116 and a plurality of the bottom conductive bumps 114, as illustrated in FIG. 1B, may be removed and leveled. In this example embodiment, a grinding process of the entire surface of the bottom mold member 116 formed on the bottom of the substrate 102 may be performed so that the bottom surface of each bottom conductive bump 114 may be exposed.

As shown in FIG. 1C, reinforcing bumps 118 may arranged on the bottom conductive bumps 114 whose lower surfaces are exposed, and attached through a bonding (or attaching) process such as reflow. In this case, the reinforcing bumps 118 may be bumps (or solder balls) for mounting (or attaching) a semiconductor package to a board (not shown).

Consequently, the semiconductor package manufactured according to the example embodiment of the present disclosure may have a structure including the substrate 102, the semiconductor die 106 formed on the substrate 102, a plurality of the top conductive bumps 108, the top mold member 110 molding the semiconductor die 106 and a plurality of the top conductive bumps 108, and a plurality of the bottom conductive bumps 114 formed on the bottom of the substrate 102 with their parts partially molded by the bottom mold member 116 in their extended directions.

FIGS. 2A to 2E are process flows illustrating a process of manufacturing a semiconductor package, in accordance with another embodiment of the present disclosure.

Figure 2A:
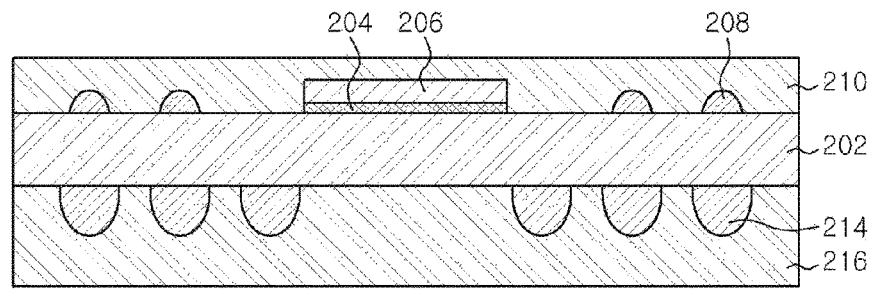
FIGS. 2A to 2E are process flows illustrating a process of manufacturing a semiconductor package, in accordance with another embodiment of the present disclosure.

Referring to FIG. 2A, a substrate 202 is shown. A semiconductor die 206 and a plurality of top conductive bumps 208 molded by a top mold member 210 may be formed on the top of the substrate 202, and a plurality of bottom conductive bumps 214 molded by a bottom mold member 216 may be formed on the bottom of the substrate 202.

The semiconductor die 206 may be attached at a target position predetermined on the top of the substrate 202 through a bump member 204 which may comprise solder balls (not shown), for example, and a plurality of the top conductive bumps 208 may be formed at given positions on the substrate 202. The top mold member 210, which molds (or buries) the semiconductor die 206 and a plurality of the top conductive bumps 208, may be formed on the top of the substrate 202. In an example scenario, the semiconductor die 206 and the conductive bumps 208 may be fully encapsulated by the mold member 210, although the disclosure is not so limited.

The top and bottom conductive bumps 208 and 214 may comprise solder, solder balls, and conductive pillars (e.g., copper posts, aluminum posts, etc.), for example. A plurality of the bottom conductive bumps 214 may be formed at desired positions on the bottom of the substrate 202, and these bottom conductive bumps 214 may be completely molded (or buried) by the thick bottom mold member 216.

Figure 2B:
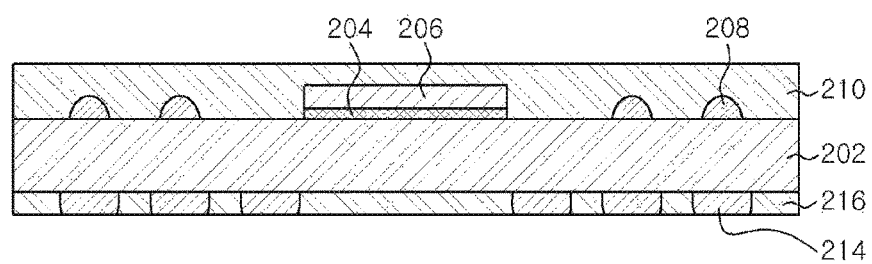

Next, by performing a back grounding process on the bottom mold member 216, which may comprise a grinding process for the entire surface of the bottom mold member 216 a portion of the bottom mold member 216 and a portion of the bottom conductive bumps 214, as illustrated in FIG. 2B, may be removed and leveled. Accordingly, the lower surface of each bottom conductive bump 214 (i.e., the surface away from the substrate 202) may be exposed.

Figure 2C:
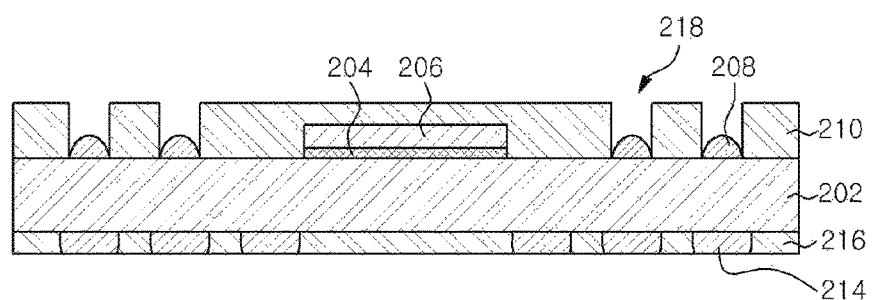

Subsequently, by selectively removing a portion of the top mold member 210 using, for example, laser drilling, the upper surface of each top conductive bump 208, as illustrated in FIG. 2C, may be exposed. That is, the upper surface of each top conductive bump 208 may be exposed through each opening 218.

Figure 2D:
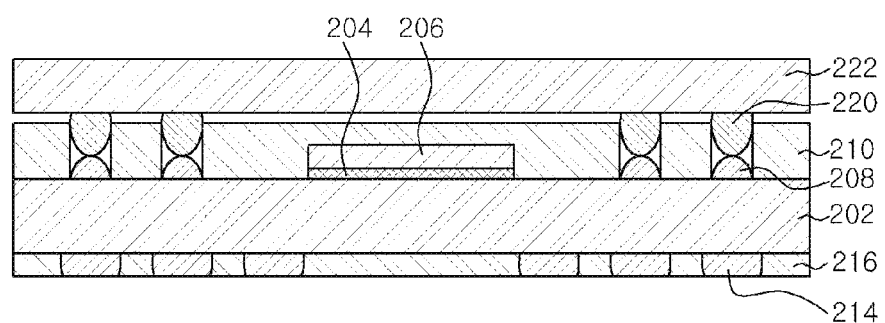
Figure 2E:
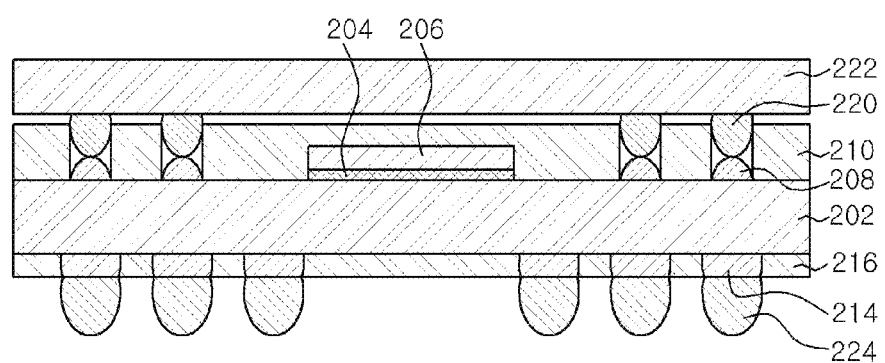

Thereafter, an extended substrate 222 may be prepared, which may comprise a plurality of bottom bumps 220 related to rearrangement of input/output (I/O) connections (not shown) for the semiconductor die 206. After arranging each bottom bump 220 of the extended substrate 222 and its corresponding upper surface of a respective top conductive bump 208 on the substrate 202 to be in contact with each other, and by performing a bonding (or attaching) process, the extended substrate 222, as illustrated in FIG. 2D, may be adhered to the top of the substrate 202. In an example scenario, the extended substrate 222 may comprise, for example, an interposer, and a plurality of the bottom bumps 220 formed on the bottom of the extended substrate 222 may comprise solder balls or conductive pillars (copper posts, aluminum posts, etc.), for example.

Reinforcing bumps 224 may be arranged on the bottom conductive bumps 214, each of which comprising a respective bottom surface that may be exposed, and then attached to each bottom conductive bump 214 through a bonding (or attaching) process such as reflow. In this case, the reinforcing bumps 224 may comprise bumps (or solder balls) for mounting (or attaching) a semiconductor package to a board (not shown).

Consequently, the semiconductor package manufactured according to an embodiment of the present disclosure may have a structure comprising the substrate 202, the semiconductor die 206 formed on the substrate 202, a plurality of the top conductive bumps 208, the top mold member 210 molding the semiconductor die 206 with the upper surfaces of a plurality of the top conductive bumps 208 exposed, the extended substrate 222 adhering to the substrate 202 with a plurality of the bottom bumps 220 and their corresponding top conductive bump 208 being touched, and a plurality of the bottom conductive bumps 214 formed on the bottom of the substrate 202 and partially encapsulated by the bottom mold member 216 in their extended directions.

FIGS. 3A to 3F are process flows illustrating a process of manufacturing a semiconductor package, in accordance with another embodiment of the present disclosure.

Figure 3A:
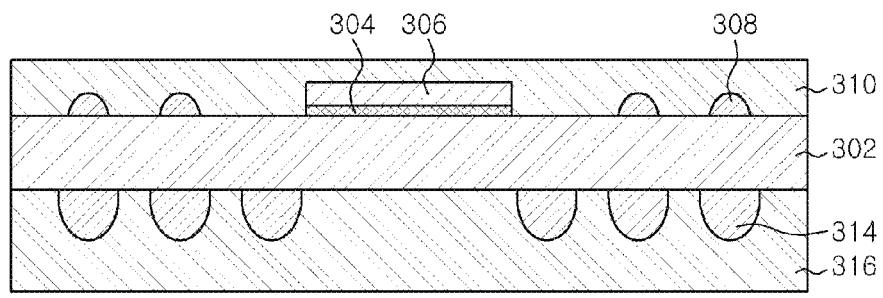
FIGS. 3A to 3F are process flows illustrating a process of manufacturing a semiconductor package, in accordance with another embodiment of the present disclosure.

Referring to FIG. 3A, a substrate 302 is shown. A semiconductor die 306 molded by a first top mold member 310 and a plurality of first top conductive bumps 308 may be formed on the top of the substrate 302, and a plurality of bottom conductive bumps 314 molded by a bottom mold member 316 may be formed on the bottom of the substrate 302.

The semiconductor die 306 may be attached at a target position predetermined on the top of the substrate 302 through a bump member 304, which may comprise solder balls (not shown), for example, and a plurality of the first top conductive bumps 308 may be formed on the desired positions of the substrate 302. The first top mold member 310 may be formed thereby encapsulating the semiconductor die 306 and a plurality of the first top conductive bumps 308.

The top and bottom conductive bumps 308 and 314 may comprise solder, solder balls, and/or conductive pillars (e.g., copper posts, aluminum posts, etc.), for example.

A plurality of the bottom conductive bumps 314 may be formed at desired positions on the bottom of the substrate 302, and the bottom conductive bumps 314 may be completely molded (or buried) by the thick bottom mold member 316.

Figure 3B:
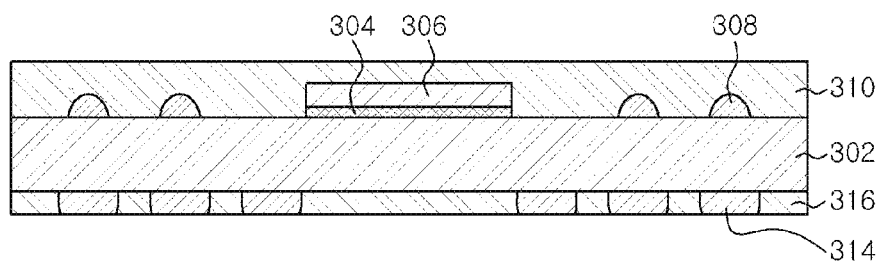

A back grinding process may then be performed on the bottom mold member 316 such that a portion of the bottom mold member 316 and the bottom conductive bumps 314, may be removed and leveled, so that the lower surface of each bottom conductive bump 314 (i.e., the surface away from the substrate 302) is exposed, as illustrated in FIG. 3B.

Figure 3C:
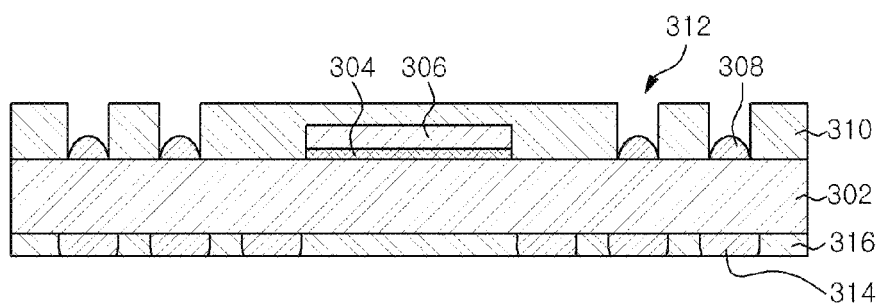

A selective removal process for the top mold member 310 may then be performed by removing a portion of the first top mold member 310 using, for example, laser drilling, such that the upper surface of the top conductive bumps 308, is exposed, as illustrated in FIG. 3C. That is, the upper surface of each first top conductive bump 308 may be exposed through each opening 318.

Figure 3D:
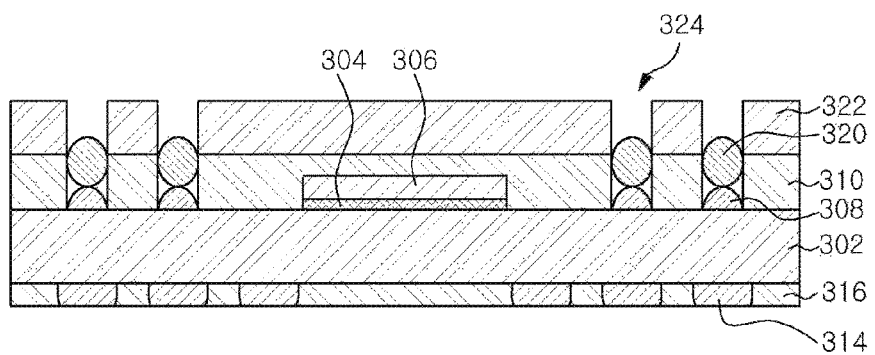

Second top conductive bumps 320 (for example, solder balls, etc.) may be arranged and attached to the first top conductive bumps 308 whose upper surfaces may be exposed through each opening 318, and a second top mold member 322 exposing each upper surface of the second top conductive bumps 320 through each opening 324 may be formed on the first top mold member 310. After molding the second top conductive bumps 320 utilizing the second top mold member 322 through a molding process, and by performing a selective removal process (for example, a laser drilling process, etc.) for the second top mold member 322, each upper surface of the second top conductive bumps 320, may be exposed through each opening 324, as illustrated in FIG. 3D.

Figure 3E:
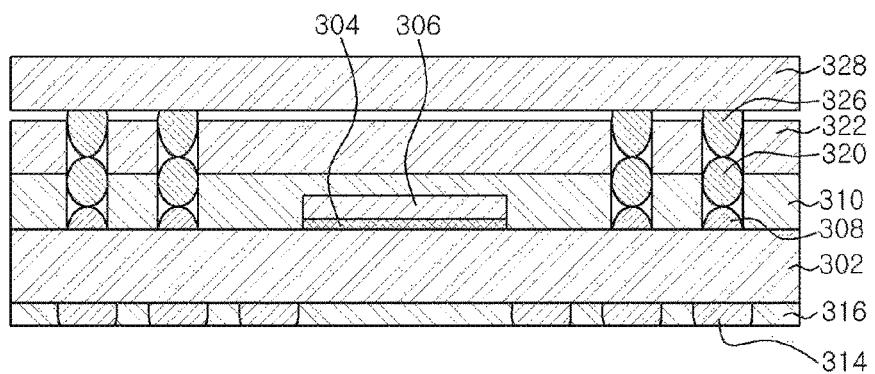

An extended substrate 328 may then be prepared, which may comprise a plurality of bottom bumps 326 related to rearrangement of I/O connections (not shown) for the semiconductor die 306. After arranging each bottom bump 326 of the extended substrate 328 and a corresponding upper surface of a respective second top conductive bumps 320 on the substrate 302 to be in contact with each other, and by performing a bonding (or attaching) process, the extended substrate 328 may be adhered to the top of the substrate, as illustrated in FIG. 3E. The extended substrate 328 may comprise an interposer, for example, and a plurality of the bottom bumps 326 formed on the bottom of the extended substrate 328 may comprise solder balls or conductive pillars (copper posts, aluminum posts, etc.), for example.

Figure 3F:
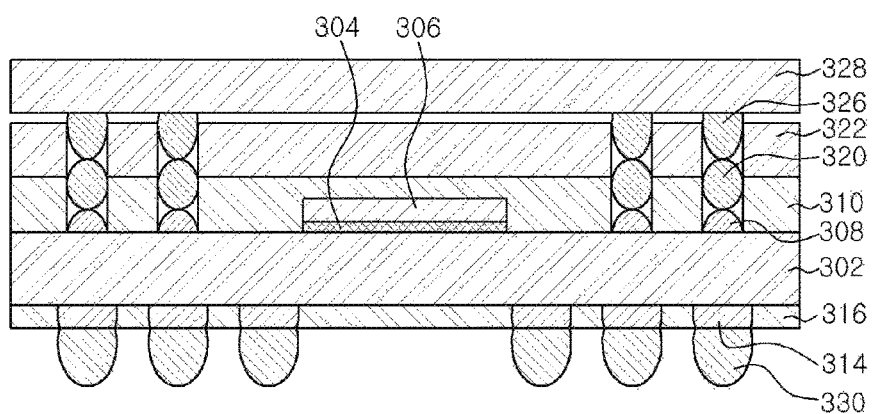

After the reinforcing bumps 330 are arranged on the bottom conductive bumps 314, each of which comprising a respective bottom surface that may be exposed, each reinforcing bump 330, as illustrated in FIG. 3F, may be attached to a respective bottom conductive bump 314 through a bonding (or attaching) process, such as reflow, for example. In this case, the reinforcing bumps 330 may comprise bumps (or solder balls) for mounting (attaching) a semiconductor package to a board (not shown).

The semiconductor package manufactured according to an embodiment of the present disclosure may comprise a structure including the substrate 302, the semiconductor die 306 formed on the substrate 302, the first top conductive bumps 308, the first top mold member 310 encapsulating the semiconductor die 306 with the upper surfaces of a plurality of the first top conductive bumps 308 exposed, the second top conductive bumps 320 attached to a plurality of the first top conductive bumps 308, the second top mold member 322 encapsulating the second top conductive bumps 320 with their upper surfaces being exposed, the extended substrate 328 attached to the substrate 302 with a plurality of the bottom bumps 326 in contact with their corresponding second top conductive bump 320, and a plurality of the bottom conductive bumps 314 formed on the bottom of the substrate 302 partially encapsulated by the bottom mold member 316 in their extended directions.

FIGS. 4A to 4F are process flows illustrating a process of manufacturing a semiconductor package, in accordance with another embodiment of the present disclosure.

Figure 4A:
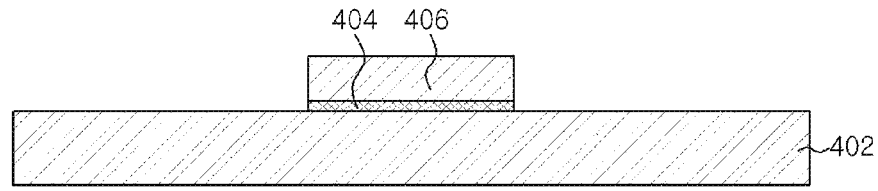
FIGS. 4A to 4F are process flows illustrating a process of manufacturing a semiconductor package, in accordance with another embodiment of the present disclosure.

Referring to FIG. 4A, a semiconductor die 406 may be attached through bump member 404, which may comprise solder balls (not shown), for example, at a target position on the top of substrate 402.

Figure 4B:
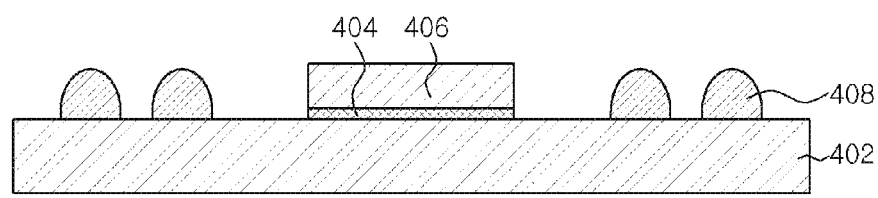

After arranging conductive members at target positions on the substrate 402, a plurality of conductive members 408, as illustrated in FIG. 4B, may be formed at desired positions on the substrate 402 through a bonding process, such as reflow, for example. The conductive members 408, for example, may comprise one or more of: solder, solder balls, conductive pillars, and conductive wires.

Figure 4C:
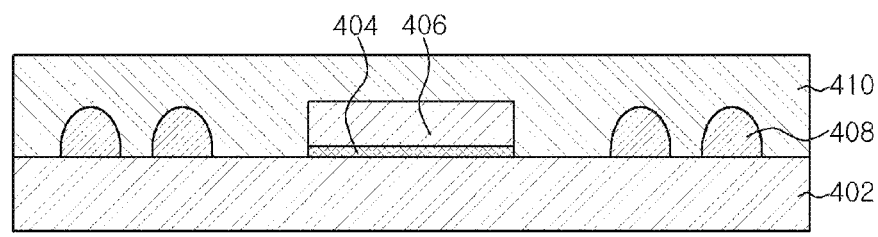

The semiconductor die 406 and a conductive members 408 may be encapsulated (or buried) by mold member 410, as illustrated in FIG. 4C, formed in a molding process.

Figure 4D:
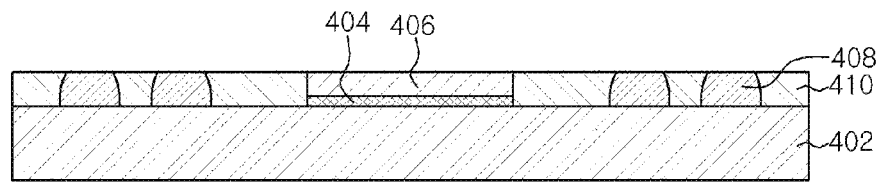
Figure 4E:
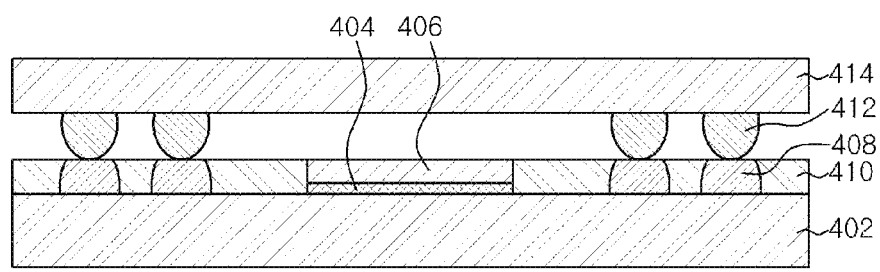

A top grinding process may be performed on the surface of the mold member 410 formed on the top of the substrate 402 with the semiconductor die 406 and conductive members 408 encapsulated (or buried), such that a portion of the mold member 410, the semiconductor die 406, and conductive members 408, as illustrated in FIG. 4D, may be removed and leveled. Accordingly, the surface of the semiconductor die 406 and the upper surface of each conductive member 408 may then be exposed.

Next, an extended substrate 414 may be prepared, which may comprise a plurality of bottom bumps 412 related to rearrangement of I/O (not shown). The extended substrate 414 may be adhered to the top of the substrate 402 by bonding the bottom bumps 412 to the corresponding upper surface of the conductive members 408 on the substrate 402. The extended substrate 414 may comprise, for example, an interposer, and the bottom conductive bumps 412 formed on the bottom of the extended substrate 414 may comprise one or more of: solder balls or conductive pillars (e.g., copper posts, aluminum posts, etc.).

Figure 4F:
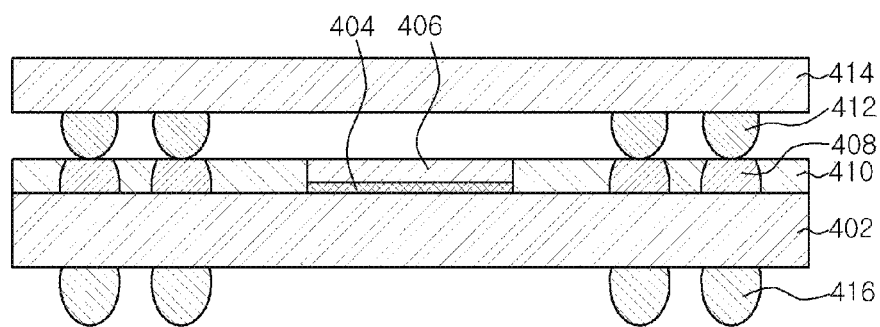

After a plurality of solder balls are arranged at target positions on the bottom of the substrate 402, a plurality of bumps 416, as illustrated in FIG. 4F, are formed at given positions on the bottom of the substrate 402 through a bonding (or attaching) process such as reflow. The bumps 416 may be solder balls for mounting (or attaching) a semiconductor package to a board (not shown).

The semiconductor package manufactured according to an embodiment of the present disclosure may comprise a structure including the substrate 402, the semiconductor die 406, conductive members 408, top mold member 410, bottom bumps 412, and the extended substrate 414. The semiconductor die 406 may be attached to the substrate 402, which may be encapsulated by the top mold member 410. A portion of the top mold member 410 and the conductive members 408 may be removed through a grinding process such that the upper surface of the semiconductor die 406 and each upper surface of the conductive members 408 may be exposed. The extended substrate 414 may be adhered to the top of the substrate 402 with a the bottom bumps 412 and their corresponding upper surface of each conductive member 408 in contact.

FIGS. 5A to 5G are process flows illustrating a process of manufacturing a semiconductor package, in accordance with another embodiment of the present disclosure.

Figure 5A:
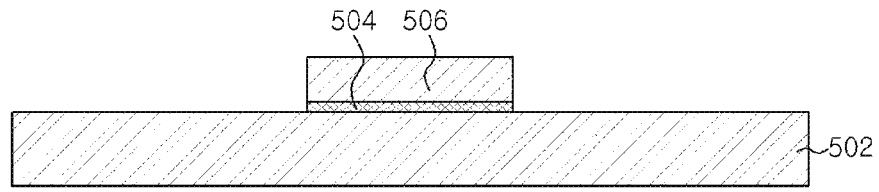
FIGS. 5A to 5G are process flows illustrating a process of manufacturing a semiconductor package, in accordance with another embodiment of the present disclosure.

Referring to FIG. 5A, a semiconductor die 506 may be attached through a bump member 504, which may comprise solder balls, for example, (not shown) at a target position predetermined on the top of a substrate 502.

Figure 5B:
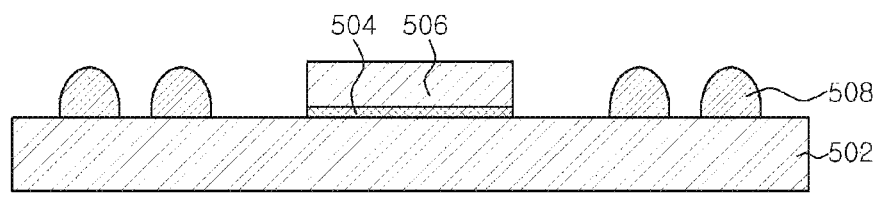

First conductive members 508 may be formed at desired positions on the substrate 502, as illustrated in FIG. 5B, through a bonding process such as reflow, for example. The first conductive members 508 may comprise one or more of solder, solder balls, conductive pillars, and conductive wires, for example.

Figure 5C:
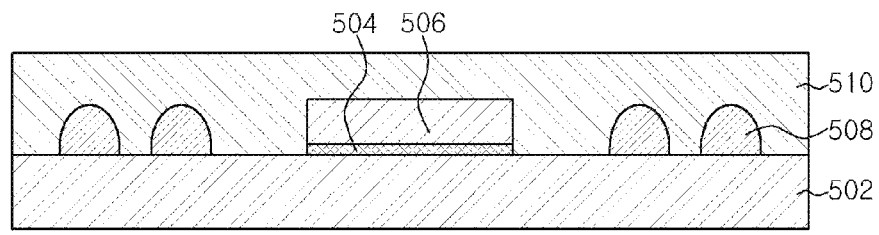

The semiconductor die 506 and first conductive members 508 may be encapsulated (or buried) by a first mold member 510, as illustrated in FIG. 5C, through a molding process.

Figure 5D:
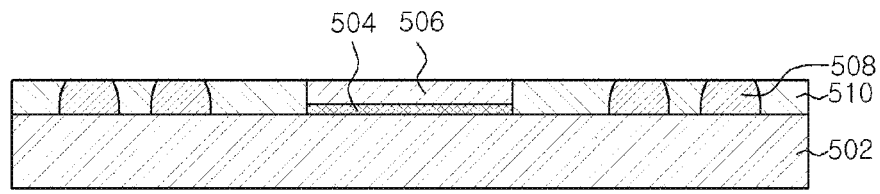

A grinding process may be performed on the surface of the first mold member 510 formed on the top of the substrate 502 with the semiconductor die 506 and the first conductive members 508 such that a portion of the first mold member 510, the semiconductor die 506, and a plurality of the first conductive members 508, as illustrated in FIG. 5D, may be removed and leveled, thereby exposing the upper surface of the semiconductor die 506 and the upper surface of first conductive members 508. In an example scenario, the molding process may completely encapsulate the semiconductor die 506 and the conductive members 508, but the disclosure is not so limited. Accordingly, the mold process need not extend above the semiconductor die 506 and the conductive members 508, but be thick enough to be thinned down through the grinding process.

Figure 5E:
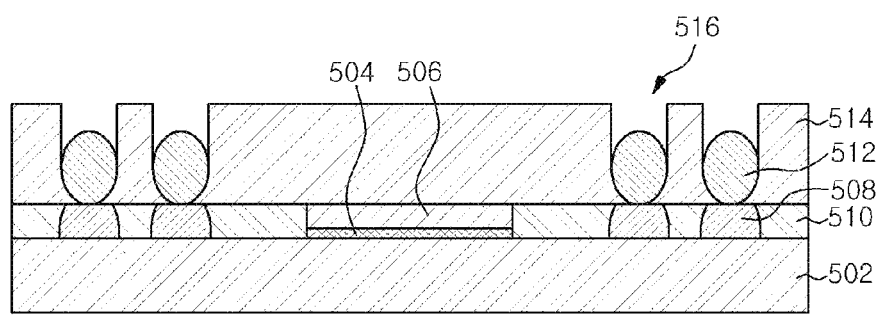

Second conductive members 512 (for example, solder balls, etc.) may be bonded, attached, and/or affixed to exposed surfaces of the first conductive members 508. A second mold member 514 may be formed on the top of the first mold member 510 with openings 516 that expose each upper surface of the second conductive members 512. In another example scenario, after the second mold member 514 is formed encapsulating the second conductive members 512, the second conductive members may be exposed by selectively removing portions of the second mold member 514 using, for example, a laser drilling process, etc, to expose each upper surface of the second conductive members 512 through each opening 516, as illustrated in FIG. 5E.

Figure 5F:
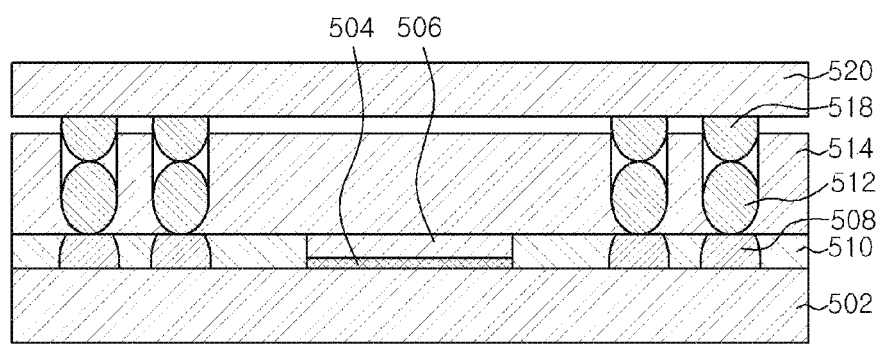

An extended substrate 520 may then be prepared, which may comprise a plurality of bottom bumps 518 related to rearrangement of I/O connections or circuitry (not shown) for the semiconductor die 506. The bottom bumps 518 of the extended substrate 520 and the upper surfaces of the second conductive members 512 on their corresponding substrate 502 may be placed in contact, and then, by performing a bonding (or attaching) process, the extended substrate 520, as illustrated in FIG. 5F, may be adhered to the top of the substrate 502. The extended substrate 520 may comprise an interposer, for example, and a plurality of the bottom bumps 518 formed on the bottom of the extended substrate 520 may comprise one or more of solder balls or conductive pillars (e.g., copper posts, aluminum posts, etc.), for example.

Figure 5G:
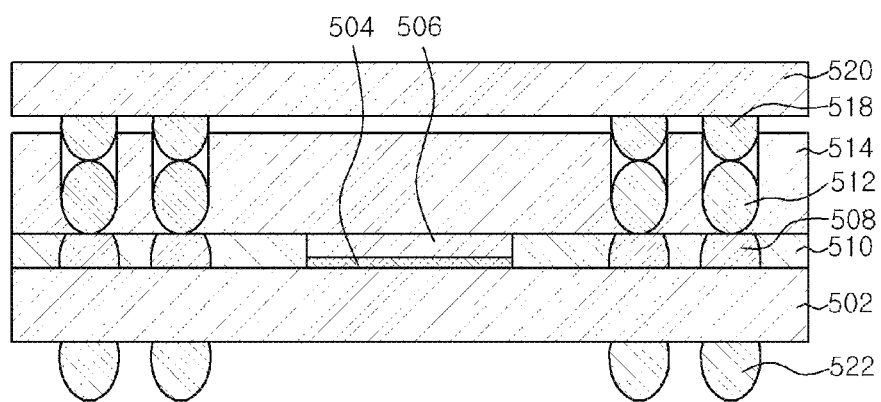

After a plurality of solder balls are arranged at target positions on the bottom of the substrate 502, a plurality of bumps 522 may be formed at desired positions on the bottom of the substrate 502, as illustrated in FIG. 5G, utilizing a bonding (or attaching) process, such as reflow, for example. The bumps 522 may comprise solder balls, for example, for mounting (or attaching) a semiconductor package to a board (not shown).

The semiconductor package manufactured according to an example embodiment of the present disclosure may comprise a structure including the substrate 502, the semiconductor die 506, and first conductive members 508 attached to the substrate 502. The semiconductor die 506 and first conductive members 508 may be encapsulated by the first mold member 510, a top portion of which may be removed and leveled utilizing a grinding process, thereby exposing the upper surface of the semiconductor die 506 and each upper surface of the first conductive members 508. The package may also comprise second conductive members 512 attached to the first conductive members 508, the second mold member 514 with the upper surfaces of a plurality of the second conductive members 512 being exposed, and the extended substrate 520 adhered to the top of the substrate 502 with a plurality of the bottom bumps 518 and their corresponding upper surface of each second conductive member 512 in contact.

Figure 6A:
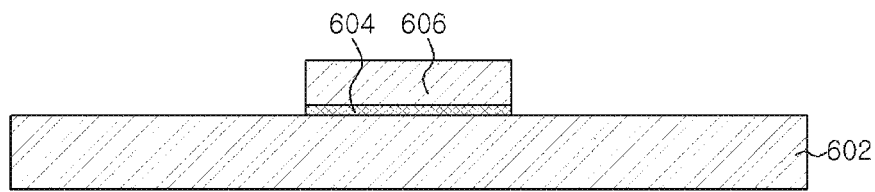
FIGS. 6A to 6G are process flows illustrating a process of manufacturing a semiconductor package, in accordance with another embodiment of the present disclosure.

Referring to FIG. 6A, a semiconductor die 606 may be attached through a bump member 604, which may comprise solder balls, for example (not shown as individual solder balls for figure clarity) at desired positions on the top of substrate 602.

Figure 6B:
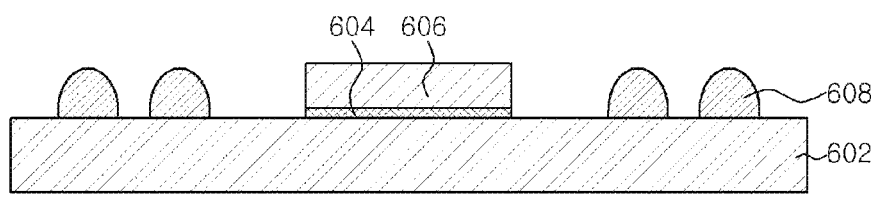

Conductive members 608 may be placed at target positions on the substrate 602 and bonded utilizing a reflow process, for example, as illustrated in FIG. 6B. The conductive members 608 may comprise one or more of solder, solder balls, conductive pillars, and conductive wires, for example.

Figure 6C:
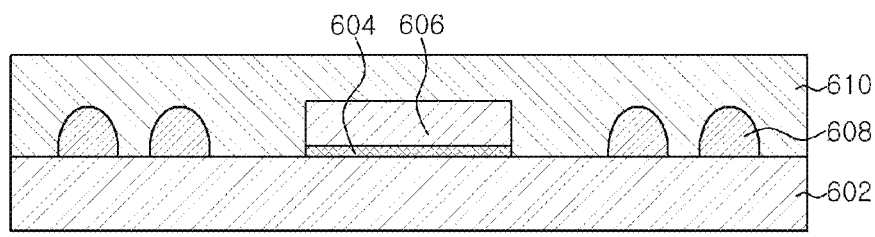

The semiconductor die 606 and conductive members 608 may be encapsulated by mold member 610, as illustrated in FIG. 6C, utilizing a molding process.

Figure 6D:
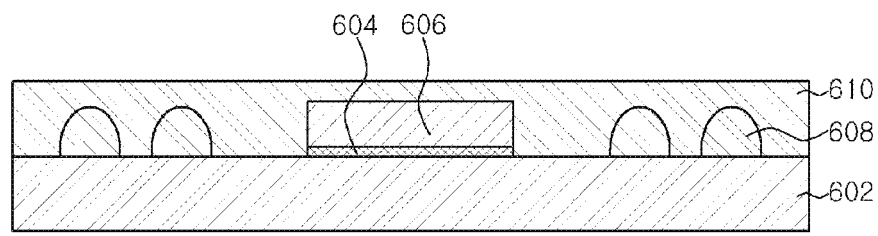

A top grinding process may then be performed on the surface of the mold member 610 thereby reducing the thickness of the mold member 61, as illustrated in FIG. 6D.

Figure 6E:
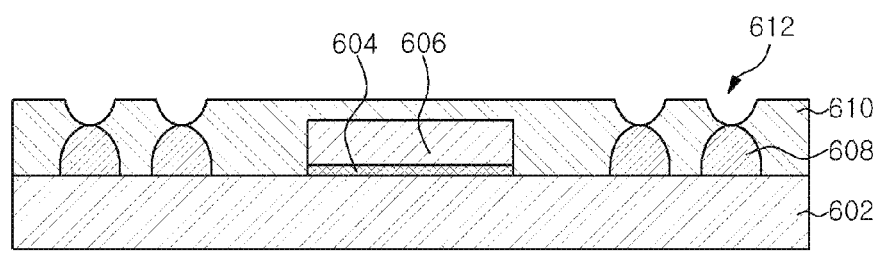

A selective removal process using laser drilling, for example, may remove a portion of the top mold member 610 to expose the upper surface of each conductive member 608, as illustrated in FIG. 6E. Accordingly, the upper surface of each conductive member 608 may be exposed through each opening 612.

Figure 6F:
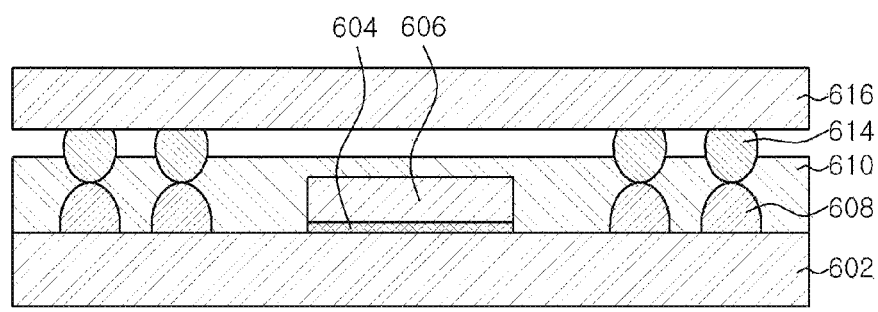

An extended substrate 616 may be prepared with a plurality of bottom bumps 614 related to rearrangement of I/O circuitry (not shown). Each bottom bump 614 of the extended substrate 616 and the upper surface of each conductive member 608 on its corresponding substrate 602 may be arranged to be in physical contact, and then through a bonding (attaching) process, the extended substrate 616 may be attached to the top of the substrate 602, as illustrated in FIG. 6F. The extended substrate 616 may comprise an interposer, for example, and a plurality of the bottom bumps 614 formed on the bottom of the extended substrate 616 may comprise one or more of solder balls and/or conductive pillars (e.g., copper posts, aluminum posts, etc.), for example.

Figure 6G:
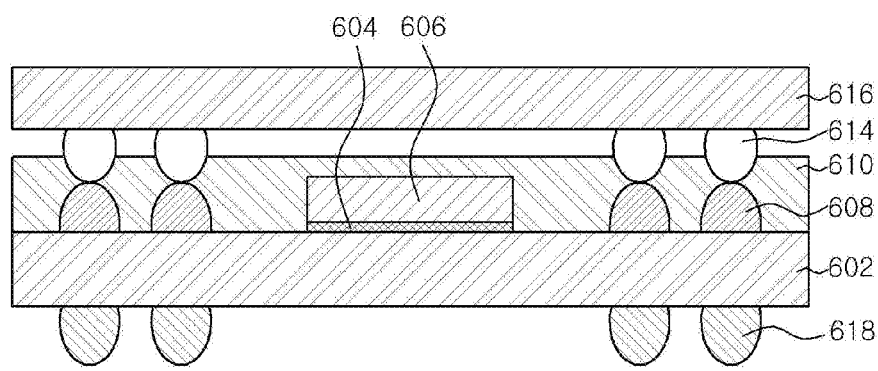

A plurality of solder balls may be arranged at target positions on the bottom of the substrate 602, thereby forming a plurality of bumps 618 on the bottom of the substrate 602, as illustrated in FIG. 6G, through a bonding (or attaching) process, such as reflow, for example. The bumps 618 may comprise solder balls, for example, for mounting (or attaching) a semiconductor package to a board (not shown).

The semiconductor package manufactured according to another example embodiment of the present disclosure may comprise a structure including the substrate 602, the semiconductor die 606 formed on the substrate 602, a plurality of the conductive members 608, the mold member 610 molding the semiconductor die 606 with the upper surfaces of a plurality of the conductive members 608 being exposed, and the extended substrate 616 adhering to the substrate 602 with a plurality of the bottom conductive bumps 614 and the upper surfaces of their corresponding conductive members 608 being in contact.

FIGS. 7A to 7H are process flows illustrating a process of manufacturing a semiconductor package, in accordance with another embodiment of the present disclosure.

Figure 7A:
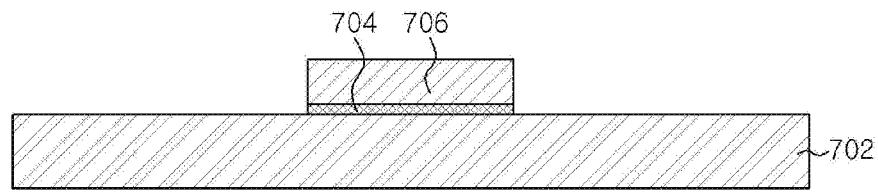
FIGS. 7A to 7H are process flows illustrating a process of manufacturing a semiconductor package, in accordance with another embodiment of the present disclosure.

Referring to FIG. 7A, a semiconductor die 706 may be attached utilizing a bump member 704, which comprises solder balls, for example, (not shown as discrete bumps for figure clarity) at a target position on the top of a substrate 702.

Figure 7B:
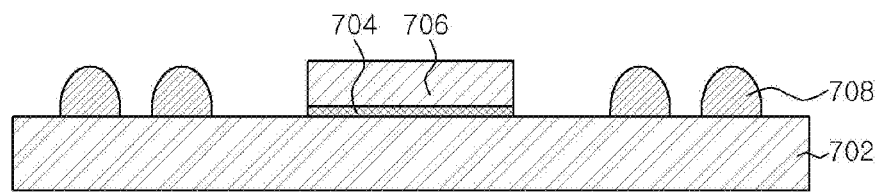

A plurality of first conductive members 708 may be placed at target positions on the substrate 702, as illustrated in FIG. 7B, and bonded through a bonding process such as reflow, for example. The first conductive members 708 may be one or more of solder, solder balls, conductive pillars, and conductive wires, for example.

Figure 7C:
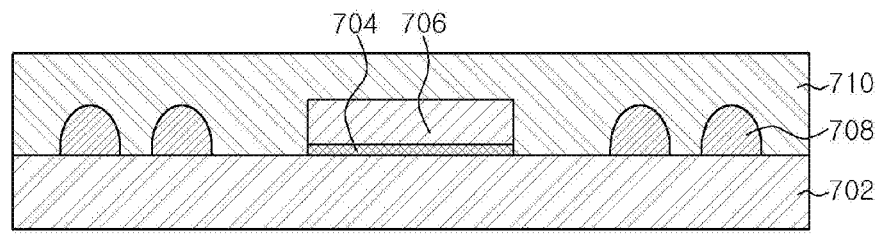

The semiconductor die 706 and a plurality of the first conductive members 708 may then be encapsulated, as illustrated in FIG. 7C, by a first mold member 710 through a molding process.

Figure 7D:
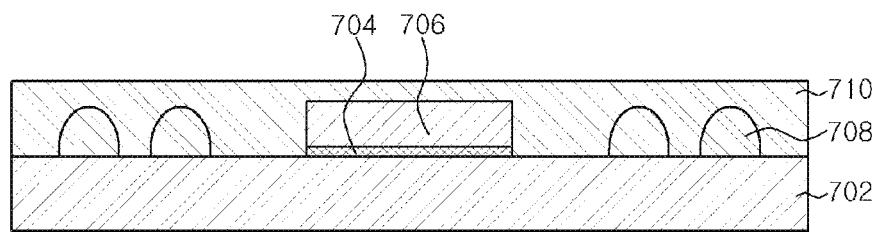

A top grinding process may then be performed on the top surface of the first mold member 710 such that a portion of the first mold member 710 may be thinned, as illustrated in FIG. 7D.

Figure 7E:
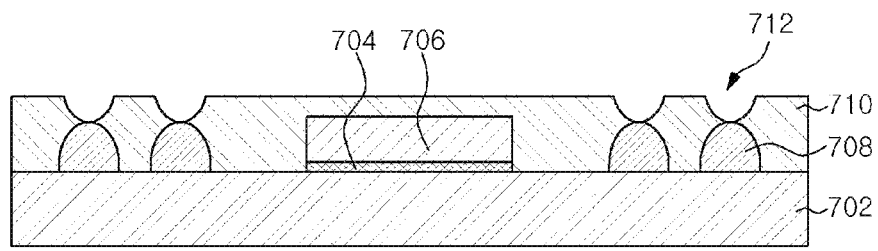
Figure 7F:
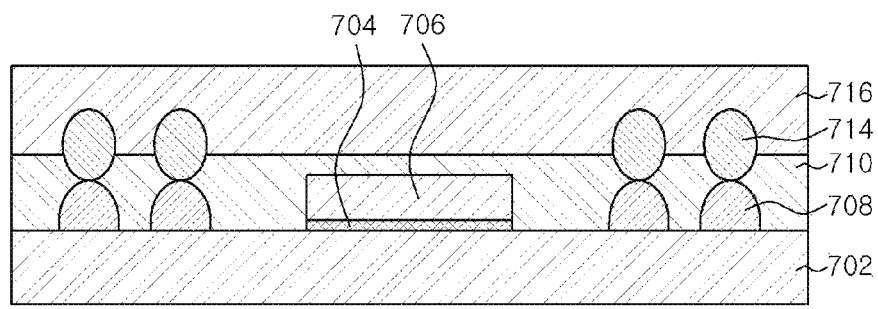

A selective removal process performed on the first mold member 710 may remove a portion of the first mold member 710, using laser drilling, for example, such that the upper surface of each first conductive member 708, may be exposed, as illustrated in FIG. 7E. The upper surface of each first conductive member 708 may therefore be exposed through each opening 712.

Second conductive members 714 (for example, solder balls, etc.) may be placed and attached on each first conductive member 708, the upper surface of which is exposed. The second conductive members may then be encapsulated in a second molding process, resulting in second mold member 716.

Figure 7G:
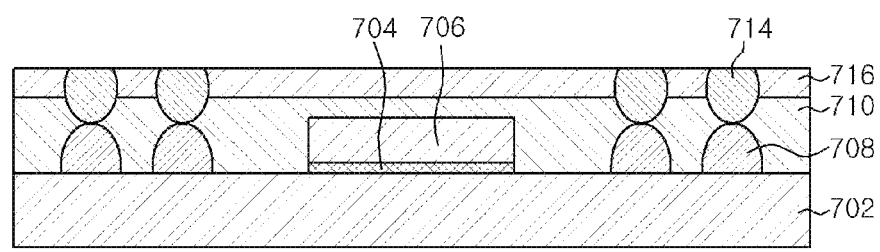

A grinding process may be performed on the second mold member 716 which encapsulates (or buries) the second conductive members 714, as illustrated in FIG. 7G, thinning the second mold member to expose the upper surface of each second conductive member 714.

Figure 7H:
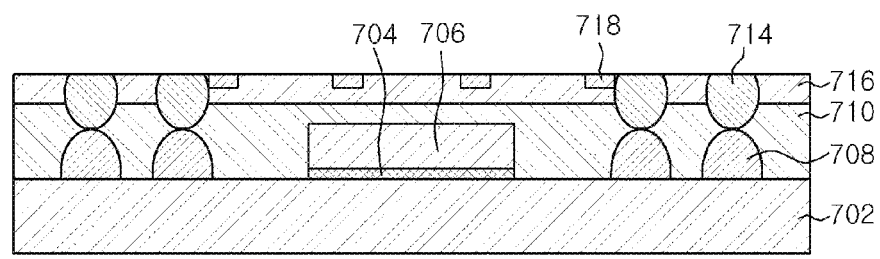

A selective removal process, such as an etching process, for example, may be utilized to form trenches in the thinned second mold member 716, which may then be filled with metal to form traces 718 with desired patterns, as illustrated in FIG. 7H, on the second mold member 716.

A plurality of solder balls may be arranged and bonded at target positions on the bottom of the substrate 702, and bumps may be formed through a bonding (attaching) process, such as reflow, for example. The bumps may be solder balls for mounting (attaching) a semiconductor package to a board (not shown).

The semiconductor package manufactured according to an example embodiment of the present disclosure may have a structure comprising the substrate 702, the semiconductor die 706 and a plurality of the first conductive members 708 formed on the substrate 702, the first mold member 710 with the upper surfaces of a plurality of the first conductive members 708 being exposed, a plurality of the second conductive members 714 which are attached to the upper surfaces of the first conductive members 708, which are in turn encapsulated by the second mold member 716. A top portion of the mold member 716 may be removed and leveled with the first mold member 710 through a grinding process, the second mold member 716 encapsulating a the second conductive members 714 with their upper surfaces being exposed, and traces 718 formed with a desired pattern on the second mold member 716.

FIGS. 8A to 8E are process flows illustrating a process of manufacturing a semiconductor package, in accordance with another embodiment of the present disclosure.

Figure 8A:
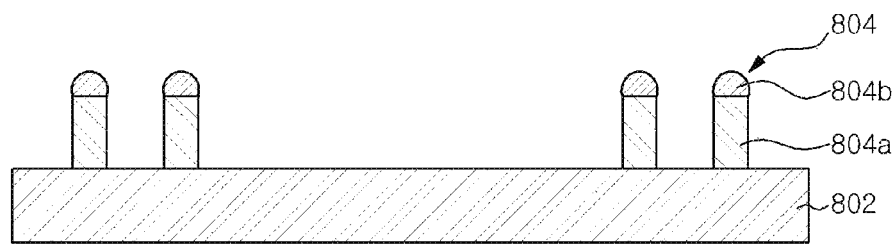
FIGS. 8A to 8E are process flows illustrating a process of manufacturing a semiconductor package, in accordance with another embodiment of the present disclosure.

Referring to FIG. 8A, a plurality of conductive pillars 804 may be formed at desired positions on a substrate 802. An example process for forming the conductive pillars 804 may comprise applying a sacrificial film on the substrate 802 and forming vias, where the vias may be filled with a conductive material or the vias may be filled with a conductive material and then solder balls attached to the top of the vias, thereby=resulting in the conductive pillars 804 on the substrate 802, as shown in FIG. 8A. The conductive pillars 804 may comprise copper posts 804A and solder balls 804B attached to the top of the copper posts 804A, for example.

Figure 8B:
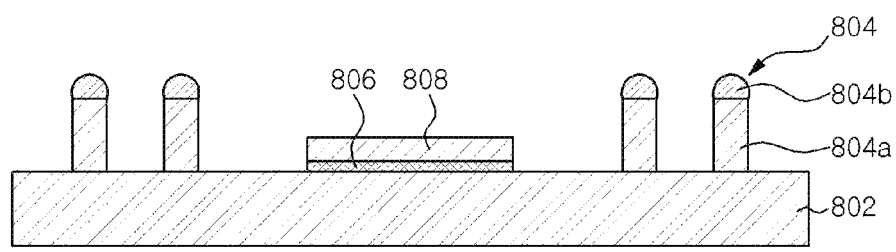

A semiconductor die 808 may be bonded to the substrate 802 utilizing an attaching process with bump member 806 which may comprise solder balls, for example, (not shown as discrete bumps for figure clarity) with the resulting structure illustrated in FIG. 8B.

Figure 8C:
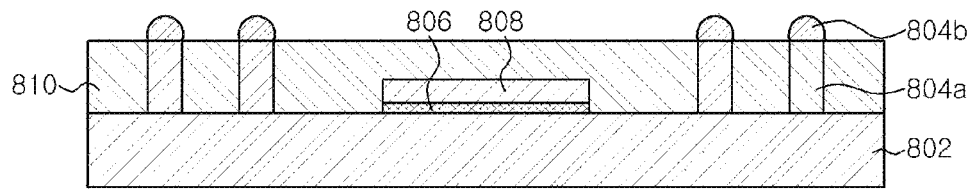

A molding process may then be performed using a film-type mold member; for example, by pressurizing and attaching the film-type mold member to the entire surface of the substrate 802, to form a mold member 810, as illustrated in FIG. 8C. The mold member 810 may encapsulate the semiconductor die 808 while exposing the solder balls 804B which may comprise the upper surfaces of the conductive pillars 804.

Figure 8D:
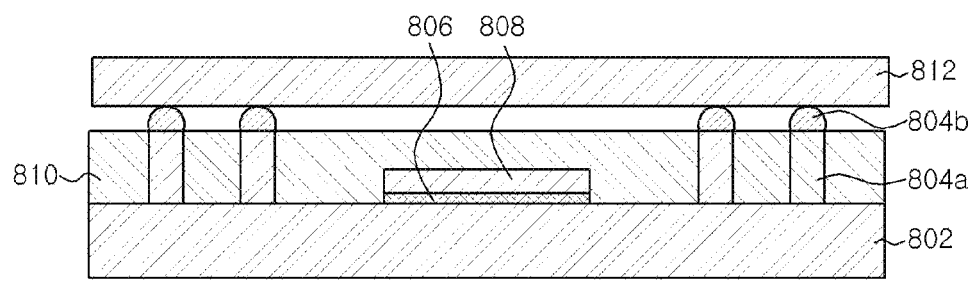
Figure 8E:
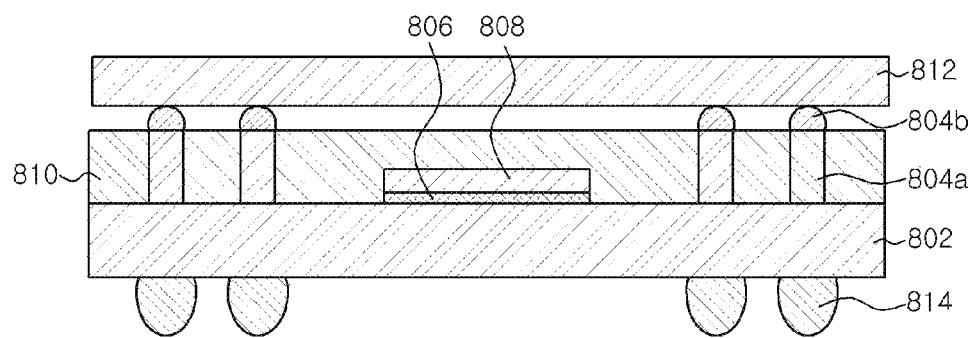

An extended substrate 812 may be prepared, with a plurality of conductive pads (not shown) related to rearrangement of I/O (not shown). Each conductive pad of the extended substrate 812 and the upper surface of each solder ball 804B on its corresponding substrate 802 may be placed in contact, and then, by performing a bonding (or attaching) process, the extended substrate 812, as illustrated in FIG. 8D, may be attached to the top of the substrate 802. The extended substrate 812 may comprise, an interposer, for example.

A plurality of solder balls may then arranged at target positions on the bottom of the substrate 802 and a plurality of bumps 814 may be formed at given positions on the bottom of the substrate 802 through a bonding (or attaching) process such as reflow, as illustrated in FIG. 8C. The bumps 814 may comprise solder balls, for example, for mounting (or attaching) a semiconductor package to a board (not shown).

The semiconductor package manufactured according to another embodiment of the present disclosure may have a structure comprising the substrate 802, the semiconductor die 808 and conductive pillars 804 formed on the substrate 802. In an example scenario, the film-type mold member 810 may encapsulate the semiconductor die 808 completely with the upper surfaces of a plurality of the conductive pillars 804 being exposed, and the extended substrate 812 adhered to the substrate 802 with a plurality of the conductive pads in contact with the upper surfaces of their corresponding conductive pillars 804.

FIGS. 9A to 9E are process flows illustrating a process of manufacturing a semiconductor package, in accordance with another embodiment of the present disclosure.

Figure 9A:
FIGS. 9A to 9E are process flows illustrating a process of manufacturing a semiconductor package, in accordance with another embodiment of the present disclosure.

Referring to FIG. 9A, a plurality of conductive pillars 904 may be formed at target positions on a substrate 902. In an example scenario, the conductive pillars 904 may be formed by applying a sacrificial film on the substrate 902, forming vias, and filling the vias with a conductive material. The conductive pillars 904 may comprise copper posts, aluminum posts, etc., for example.

Figure 9B:
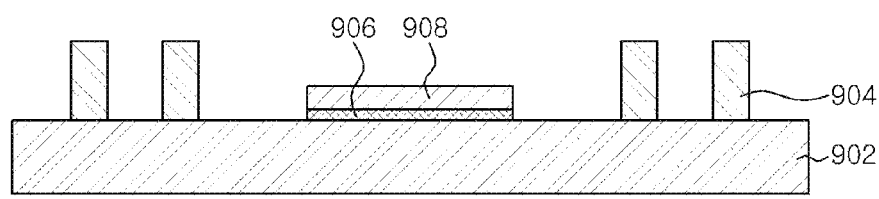

A semiconductor die 908 may be bonded to the substrate 902 utilizing bump member 906, which may comprise solder balls, for example, as illustrated in FIG. 9B.

Figure 9C:
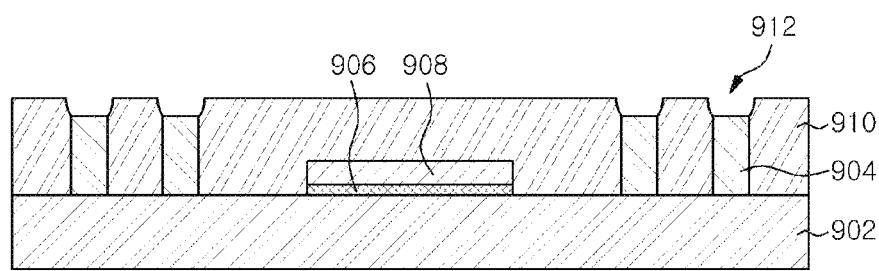

A molding process may be utilized to encapsulate the conductive pillars 904 and the semiconductor die 908 utilizing mold member 910. A selective removal process (for example, a laser drilling process, etc.) may be utilized to expose the upper surface of the conductive pillars 904 through each opening 912, as illustrated in FIG. 9C.

Figure 9D:
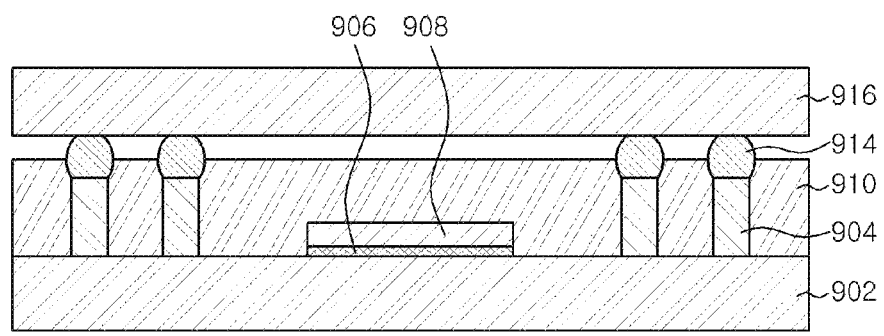

An extended substrate 916 may be prepared with a plurality of bottom bumps 914 related to rearrangement of I/O (not shown). Each bottom bump 914 of the extended substrate 916 may be placed in contact with the upper surface of each conductive pillar 904 on its corresponding substrate 902, and then bonded to the substrate 902 by performing a bonding (or attaching) process, as illustrated in FIG. 9D. Herein, the extended substrate 916 may comprise an interposer, for example, and a plurality of the bottom bumps 914 formed on the bottom of the extended substrate 916 may comprise solder balls, for example.

Figure 9E:
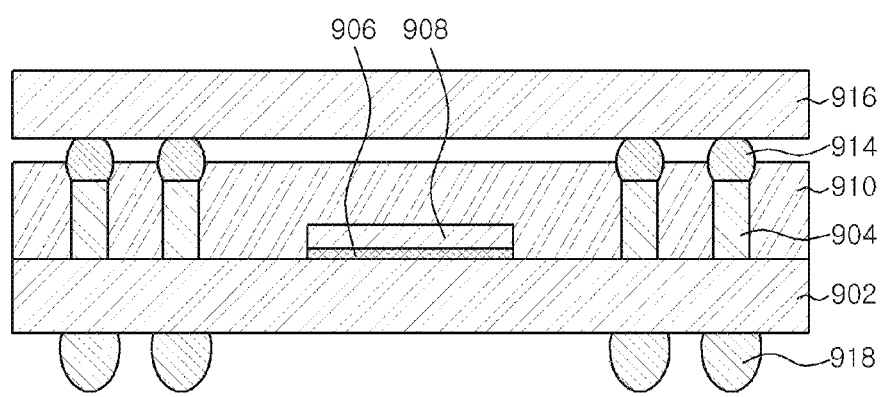

In an example scenario, a plurality of solder balls may be arranged at target positions on the bottom of the substrate 902, and subjected to a bonding process, such as reflow, for example, thereby forming bumps 918, as illustrated in FIG. 9E. The bumps 918 may comprise solder balls for mounting (or attaching) a semiconductor package to a board (not shown).

This disclosure provides example embodiments supporting the present invention. The scope of the present invention is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure, a semiconductor device comprises an embedded semiconductor die and substrate-to-substrate interconnects, and may comprise a substrate having a top surface and a bottom surface, a semiconductor die bonded to the top surface of the substrate, a first mold material encapsulating the semiconductor die and at least a portion of the top surface of the substrate, and a first conductive bump that is on the top surface of the substrate and is at least partially encapsulated by the first mold material. An extended substrate may be coupled to the substrate utilizing the first conductive bump.

A second conductive bump may be formed on the bottom surface of the substrate, and a second mold material may encapsulate at least a portion of the second conductive bump and at least a portion of the bottom surface of the substrate. A third mold material may be formed between the first mold material and the extended substrate. The third mold material may encapsulate at least a portion of a third conductive bump on the first conductive bump. The extended substrate may comprise a fourth conductive bump coupled to the third conductive bump. A bottom surface of the second conductive bump may be coplanar with a bottom surface of the second mold material. A reinforcing bump may be formed on the bottom surface of the second conductive bump. The first and second conductive bumps may comprise solder balls and/or copper pillars. The extended substrate may comprise an interposer.

While various aspects supporting the invention have been described with reference to certain example embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular example embodiments disclosed, but that the present invention will include all embodiments falling within the scope of the appended claims.

What is claimed is:

1. A method of manufacturing an electronic device, the method comprising:
   coupling a semiconductor die to a top side of a substrate, wherein a bottom side of the substrate comprises a plurality of positions for coupling a plurality of bottom side conductive interconnection structures;
   forming a plurality of conductive interconnection structures on the top side of the substrate and that are laterally displaced from the semiconductor die;
   encapsulating at least a portion of the top side of the substrate, at least a portion of the semiconductor die, and at least a portion of each of the conductive interconnection structures, in an encapsulating material;
   planarizing at least a top side of the encapsulating material and a respective top end of each of the conductive interconnection structures such that the planarized top side of the encapsulating material and the respective planarized top end of each of the conductive interconnection structures are coplanar; and
   forming a top side interposer above the planarized encapsulating material, wherein said forming the top side interposer comprises:
      forming a top side dielectric layer and a top side conductor layer comprising a plurality of top side conductors, wherein each of the plurality of top side conductors is coupled to a respective one of the conductive interconnection structures through at least a respective aperture in the top side dielectric layer; and
      forming a second top side dielectric layer and a second top side conductor layer comprising a second plurality of top side conductors, wherein each of the second plurality of top side conductors is coupled to a respective one of the plurality of top side conductors.

2. The method of claim 1, wherein said planarizing comprises planarizing a top side of the semiconductor die such that the top side of the encapsulating material, the respective top end of each of the conductive interconnection structures, and the top side of the semiconductor die are coplanar.

3. The method of claim 1, wherein there is no gap between the encapsulating material the top side dielectric layer.

4. The method of claim 1, wherein said forming the top side dielectric layer and the top side conductor layer comprises sequentially forming the top side dielectric layer and the top side conductor layer.

5. The method of claim 4, wherein there is a gap between the top side dielectric layer and the second top side dielectric layer.

6. The method of claim 3, comprising after said forming the top side interposer, forming coupling the plurality of bottom side conductive interconnection structures at the plurality of positions on the bottom side of the substrate.

7. The method of claim 1, wherein each of the plurality of conductive interconnection structures comprises a copper pillar.

8. A method of manufacturing an electronic device, the method comprising:
- coupling a semiconductor die to a top side of a substrate;
- forming a plurality of conductive interconnection structures on the top side of the substrate and that are laterally displaced from the semiconductor die;
- encapsulating at least a portion of the top side of the substrate, at least a portion of the semiconductor die, and at least a portion of each of the conductive interconnection structures, in an encapsulating material;
- removing a portion of the encapsulating material to expose a respective top end of each of the plurality of conductive interconnection structures;
- after said removing a portion of the encapsulating material, forming a top side interposer above the encapsulating material, said forming the top side interposer comprising forming a top side dielectric layer and forming a top side conductor layer comprising a plurality of top side conductors; and
- after said forming the top side interposer, forming bottom side conductive interconnection structures on a bottom side of the substrate.

9. The method of claim 8, wherein said forming the top side dielectric layer comprises forming the top side dielectric layer directly on the encapsulating material.

10. The method of claim 9, wherein said forming the top side dielectric layer comprises forming the top side dielectric layer directly on the semiconductor die.

11. The method of claim 8, wherein each of the plurality of top side conductors is coupled to a respective one of the conductive interconnection structures through at least a respective aperture in the top side dielectric layer.

12. The method of claim 11, wherein said forming the top side interposer comprises forming a second top side dielectric layer and a second top side conductor layer comprising a second plurality of top side conductors, wherein each of the second plurality of top side conductors is coupled to a respective one of the plurality of top side conductors.

13. The method of claim 8, wherein the bottom side conductive interconnection structures are for mounting the electronic device to a board.

14. The method of claim 8, wherein said removing a portion of the encapsulating material comprises planarizing at least a top side of the encapsulating material and a respective top end of each of the conductive interconnection structures such that the planarized top side of the encapsulating material and the respective planarized top end of each of the conductive interconnection structures are coplanar.

15. A method of manufacturing an electronic device, the method comprising:
- providing a semiconductor die coupled to a top side of a substrate;
- providing a plurality of conductive interconnection structures on the top side of the substrate and laterally displaced from the semiconductor die;
- encapsulating the electronic device with an encapsulating material, the encapsulating material covering at least a portion of the top side of the substrate, at least a portion of the semiconductor die, and at least a portion of each of the conductive interconnection structures;
- removing a portion of the encapsulating material to expose a respective end of each of the conductive interconnection structures; and
- after said removing the portion of the encapsulating material, forming a bottom side dielectric layer and forming a bottom side conductor layer comprising a plurality of bottom side conductors on a bottom side of the substrate.

16. The method of claim 15, wherein the bottom side dielectric layer comprises molding material.

17. The method of claim 15, wherein each of the plurality of bottom side conductors comprises a conductive ball.

18. The method of claim 15, wherein a bottom surface of the bottom side dielectric layer and a respective bottom surface of each of the plurality of bottom side conductors are coplanar.

19. The method of claim 18, comprising forming a second bottom side conductor layer comprising a second plurality of bottom side conductors below the bottom side conductor layer, wherein each of the second plurality of bottom side conductors is coupled to a respective one of the plurality of bottom side conductors.

20. The method of claim 15, comprising forming a top side interposer above the encapsulating material by, at least in part, forming a top side dielectric layer directly on a top side of the encapsulating material.

\* \* \* \* \*